(12) United States Patent
Teo et al.

(10) Patent No.: US 7,762,729 B2
(45) Date of Patent: Jul. 27, 2010

(54) ELECTROMAGNETIC RADIATION SHIELD FOR AN OPTICAL SUBASSEMBLY

(75) Inventors: Tat Ming Teo, Compassvale Link (SG); Gary Landry, Allen, TX (US); Harold Y. Walker, Jr., Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/130,833

(22) Filed: May 30, 2008

(65) Prior Publication Data
US 2008/0298752 A1 Dec. 4, 2008

Related U.S. Application Data

(63) Continuation-in-part of application No. 12/125,748, filed on May 22, 2008, now Pat. No. 7,621,678.

(60) Provisional application No. 60/941,214, filed on May 31, 2007.

(51) Int. Cl.
G02B 6/36 (2006.01)
(52) U.S. Cl. .......................... 385/92; 385/88; 250/515.1
(58) Field of Classification Search ............ 385/88–94, 385/147; 250/515.1; 361/800, 816, 818
See application file for complete search history.

(56) References Cited

U.S. PATENT DOCUMENTS

| 3,787,014 | A | * | 1/1974 | Story et al. | .................. 248/558 |
| 4,891,020 | A | * | 1/1990 | Dunn | ......................... 439/405 |
| 5,852,257 | A | * | 12/1998 | Dittman et al. | ................ 174/59 |
| 6,163,454 | A | | 12/2000 | Strickler | |
| 6,407,932 | B1 | | 6/2002 | Gaio et al. | |
| 6,474,876 | B1 | * | 11/2002 | Sikorski, Jr. | .................. 385/55 |
| 6,652,158 | B2 | * | 11/2003 | Bartur et al. | ................... 385/92 |
| 6,744,639 | B1 | * | 6/2004 | Branch et al. | ................ 361/818 |
| 6,764,338 | B2 | | 7/2004 | Fang | |
| 7,111,994 | B2 | * | 9/2006 | Schwiebert et al. | ........... 385/92 |
| 7,229,295 | B2 | | 6/2007 | Ice et al. | |
| 7,476,039 | B2 | * | 1/2009 | Moore | .......................... 385/92 |
| 2001/0024551 | A1 | * | 9/2001 | Yonemura et al. | ............. 385/88 |
| 2002/0012503 | A1 | * | 1/2002 | Kuhne | .......................... 385/70 |
| 2003/0156802 | A1 | * | 8/2003 | Togami et al. | ................. 385/92 |
| 2004/0037517 | A1 | * | 2/2004 | Dair et al. | ...................... 385/92 |
| 2005/0286839 | A1 | * | 12/2005 | Yoshikawa | .................... 385/92 |
| 2006/0045436 | A1 | * | 3/2006 | Wang et al. | .................... 385/92 |
| 2006/0098924 | A1 | | 5/2006 | Anderl et al. | |
| 2006/0263013 | A1 | | 11/2006 | Sone | |
| 2007/0201798 | A1 | * | 8/2007 | Kramer et al. | ................. 385/75 |

OTHER PUBLICATIONS

Tat-Ming Teo et al., Electromagnetic Radiation Shield for an Optical Subassembly, U.S. Appl. No. 12/130,843, filed May 30, 2008.
Landry et al., Electromagnetic Radiation Shield for an Optical Subassembly, U.S. Appl. No. 12/125,748, filed May 22, 2008.

(Continued)

*Primary Examiner*—Ellen Kim
(74) *Attorney, Agent, or Firm*—Workman Nydegger

(57) ABSTRACT

In one example embodiment, an electromagnetic radiation (EMR) shield includes a central portion, a plurality of arms extending radially outward from the central portion, and a substantially centrally located opening defined in the central portion. The perimeter of the central portion is approximately the same size and shape as that of a portion of an associated optical subassembly (OSA).

20 Claims, 5 Drawing Sheets

OTHER PUBLICATIONS

United States Patent and Trademark Office, U.S. Appl. No. 12/125,748, Office action mailed Dec. 19, 2008.

Amendment "A" and Response to Office action mailed Dec. 19, 2008, U.S. Appl. No. 12/125,748, response filed Apr. 10, 2009.

* cited by examiner

ELECTROMAGNETIC RADIATION SHIELD FOR AN OPTICAL SUBASSEMBLY

CROSS-REFERENCE TO RELATED APPLICATIONS

The present application is a continuation in part of U.S. patent application Ser. No. 12/125,748, filed May 22, 2008, and entitled "Electromagnetic Radiation Shield for an Optical Subassembly," which claims priority from U.S. Provisional Patent Application Ser. No. 60/941,214, filed May 31, 2007 and entitled "Electromagnetic Radiation Shield for an Optical Subassembly," each of which is incorporated herein by reference in its entirety.

BACKGROUND

Optoelectronic modules, such as optoelectronic transceiver or transponder modules, are increasingly used in electronic and optoelectronic communication. Optoelectronic modules generally include one or more optical subassemblies (OSAs), such as a transmitter optical subassembly (TOSA) and/or a receiver optical subassembly (ROSA). Each OSA of an optoelectronic module is generally positioned proximate an optical port of the optoelectronic module. Each optical port is configured to receive an optical fiber connector, such as an LC or an SC connector, such that the corresponding optical fiber is capable of optically and mechanically interfacing with the OSA.

Optoelectronic modules also generally include one or more printed circuit boards having electronic circuitry. The electronic circuitry of a printed circuit board can create electromagnetic radiation (EMR). When EMR inadvertently escapes from an optoelectronic module, the EMR can cause electromagnetic interference (EMI) in nearby electronic devices which can degrade the functionality of those electronic devices. Therefore, it is important to control the inadvertent escape of EMR from optoelectronic modules. In addition, as host devices are configured to simultaneously interface with increasing numbers of optoelectronic modules, and as data rates of optoelectronic modules increase, the inadvertent escape of EMR becomes increasingly problematic.

Another related problem is the electromagnetic susceptibility (EMS) of optoelectronic modules. The EMS of an optoelectronic module is the degree to which the optoelectronic module is subject to malfunction or failure under the influence of electromagnetic radiation. Therefore, it is also important to control the inadvertent introduction of EMR into optoelectronic modules.

Controlling the escape/introduction of EMR from/into an optoelectronic module is generally accomplished by surrounding the optoelectronic module, as much as possible, with a housing formed from an electrically conductive material, which limits the escape/introduction of EMR, thus decreasing EMI in nearby electronic devices and in the optoelectronic module. It can be difficult, however, to control the transmission of EMR through required openings in the housing of an optoelectronic module, such as the optical ports that are configured to receive optical fiber connectors.

As mentioned above, each OSA in an optoelectronic module is generally positioned proximate an optical port of the optoelectronic module. Each OSA is generally formed from a non-electrically conductive material, such as plastic, and is therefore not effective at limiting the transmission of EMR. EMR may, therefore, pass through the OSA and exit and/or enter the optoelectronic module through the corresponding optical port.

Attempts have been made to control the amount of EMR that passes through an OSA. One such attempt involved shielding a plastic OSA by coating the OSA with metal. This attempt proved problematic, however, due to the increased effort required to securely adhere metal to the plastic OSA, which resulted in the metal coating flaking off, thus decreasing the effectiveness of the shielding. This attempt also failed to address the lack of shielding where the OSA interfaces with an optical fiber.

Another attempt at controlling the amount of EMR that passes through an OSA involved forming the OSA from metal instead of plastic. This attempt also proved problematic because of the increased cost in manufacturing a metal OSA over a plastic OSA. This attempt also failed to address the lack of shielding where the OSA interfaces with an optical fiber.

In light of the above discussion, a need currently exists for an OSA that is effective at limiting the transmission of EMR out of and/or into an optoelectronic module into which the OSA is integrated.

BRIEF SUMMARY OF SOME EXAMPLE EMBODIMENTS

In general, example embodiments of the invention relate to an electromagnetic radiation (EMR) shield for an optical subassembly (OSA). In some example embodiments, the example EMR shields disclosed herein can aid in the control of the amount of EMR that passes through OSAs into which the EMR shields are integrated. These example OSAs can, in turn, be effective at limiting the transmission of EMR out of and/or into optoelectronic modules into which the OSAs are integrated. These example OSAs can be effective at limiting the transmission of EMR while avoiding the difficulties and costs associated with coating OSAs with metal or forming OSAs from metal.

In one example embodiment, an EMR shield includes a central portion, a plurality of arms extending radially outward from the central portion, and a substantially centrally located opening defined in the central portion. The perimeter of the central portion is approximately the same size and shape as that of a portion of an associated OSA.

In another example embodiment, an OSA includes a body and an EMR shield. The body includes a receptacle, a neck extending from the receptacle, a flange extending from the neck, and a barrel extending from the flange and defining a cavity. The EMR shield is at least partially embedded in the body. The EMR includes a central portion, a plurality of arms extending radially outward from the central portion, and a substantially centrally located opening defined in the central portion. The opening has a diameter that is smaller than the diameter of the cavity.

In yet another example embodiment, an optoelectronic module includes a housing, a printed circuit board (PCB) at least partially positioned within the housing, and an OSA at least partially positioned within the housing and electrically connected to the PCB. The OSA includes a body and an EMR shield. The body includes a receptacle with a transducer disposed therein, a neck extending from the receptacle, a flange extending from the neck, and a barrel extending from the flange that defines a cavity. The EMR shield is at least partially embedded in the OSA. The EMR shield includes a central portion, a plurality of arms extending radially outward from the central portion, and a substantially centrally located opening defined in the central portion. Each of the plurality of arms includes a portion that extends outside the body and is biased against the housing. The opening has a diameter that is smaller than the diameter of the cavity.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to electromagnetic radiation (EMR) shields for use in optical subassemblies (OSAs), such as transmitter optical subassemblies (TOSAs) and/or receiver optical subassemblies (ROSAs). The example EMR shields disclosed herein can aid in controlling the amount of EMR that passes through OSAs in connection with which the EMR shields are employed. These OSAs can, in turn, be effective at limiting the transmission of EMR out of and/or into optoelectronic modules into which the OSAs are integrated, while avoiding the difficulties and costs associated with approaches such as coating OSAs with metal, or forming OSAs from metal.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Optoelectronic Module

Figure 1:
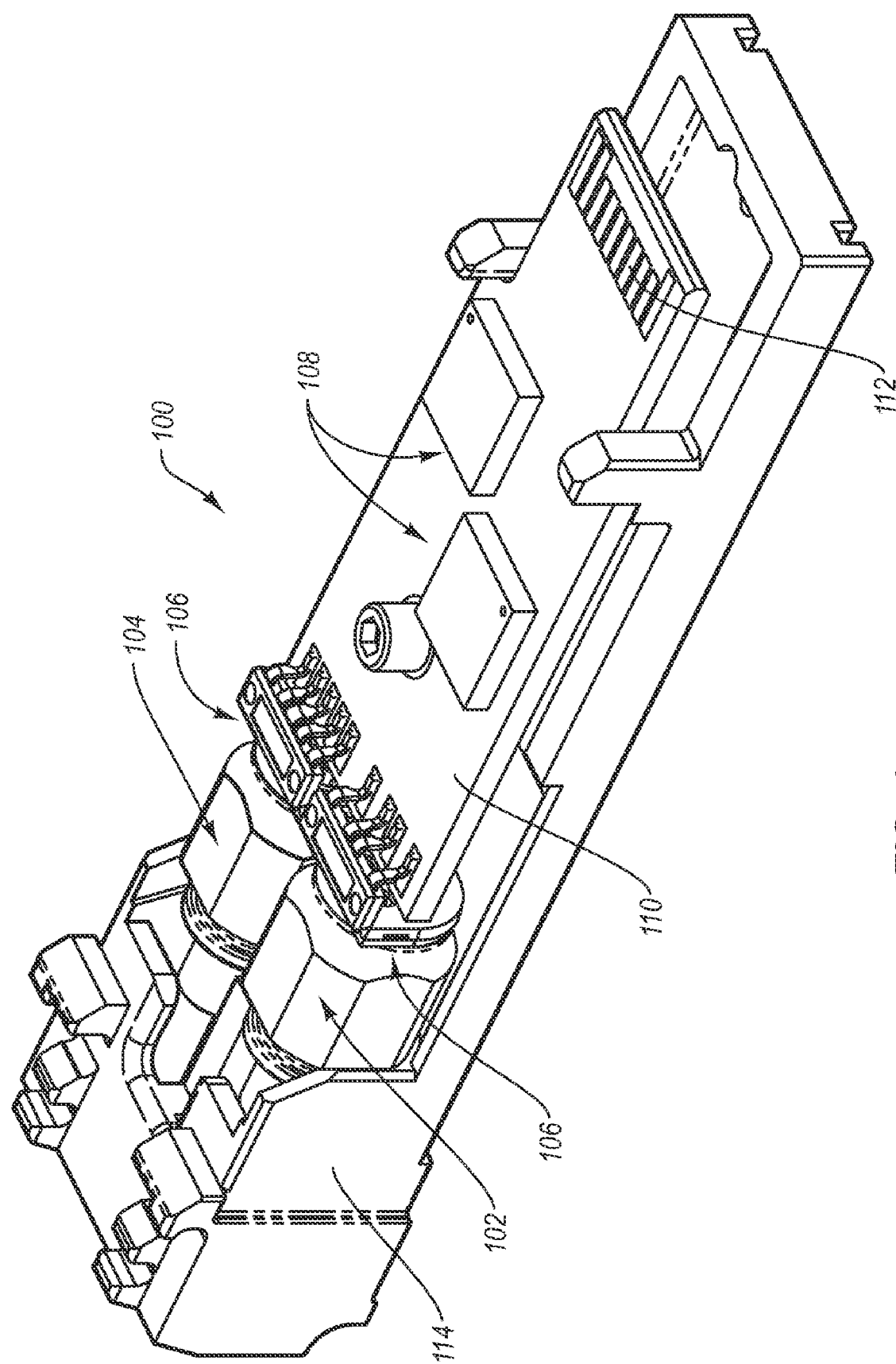
FIG. 1 is a perspective view of a portion of an example optoelectronic module.

Reference is first made to FIG. 1, which is a perspective view of an example optoelectronic module, generally designated at 100, for use in transmitting and receiving optical signals in connection with one or more other devices on a network, and communicating via electrical signals with a host device. The optoelectronic module 100 is one environment in which example embodiments of the invention can be practiced. As disclosed in FIG. 1, the optoelectronic module 100 includes various components, including a ROSA 102, a TOSA 104, electrical interfaces 106, and various electronic components 108 of a printed circuit board ("PCB") 110.

An edge connector 112 is located on an end of the PCB 110 to enable the optoelectronic module 100 to electrically interface with a host device (not shown). As such, the PCB 110 facilitates electrical communication between the ROSA 102/TOSA 104 and the host device. In addition, the above-mentioned components of the optoelectronic module 100 are partially housed within a shell 114. The shell 114 can cooperate with a cover portion (not shown) to comprise a housing for the components of the optoelectronic module 100.

The optoelectronic module 100 can be configured for optical signal transmission and reception at a variety of per-second data rates including, but not limited to, 1.25 Gbit, 2.125 Gbit, 2.5 Gbit, 2.67 Gbit, 4.25 Gbit, 8.5 Gbit, 10 Gbit, 10.3 Gbit, 10.5 Gbit, or higher. Further, the optoelectronic module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, 1610 nm, or longer wavelengths. Also, the optoelectronic module 100 can be configured to support various communication protocols including, but not limited to, Fast Ethernet, Gigabit Ethernet, 10 Gigabit Ethernet, 1x, 2x, 4x, 8x, and 10x Fibre Channel, and SONET OC-3, OC-12, OC-48, OC-192, and OC-768. Further, the optoelectronic module 100 can be configured to operate at various temperature ranges including, but not limited to, 0° C. to 70° C. and −40° C. to 85° C. In addition, the optoelectronic module 100 can be configured to assume a variety of different form factors that are substantially compliant with various transceiver and/or transponder MSAs including, but not limited to, SFF, SFP, XFP, XPAK, X2, or XENPAK.

With continued reference to FIG. 1, the ROSA 102 houses an optical receiver such as a photodiode (not shown) that is electrically coupled to one of the electrical interfaces 106. The TOSA 104 similarly houses an optical transmitter such as a laser (not shown) that is electrically coupled to the other electrical interface 106. The optical receiver is configured to convert optical signals received through an optical port (not shown) into corresponding electrical signals that are relayed to the PCB 110. The optical transmitter is configured to convert electrical signals received through the PCB 110 from a host device (not shown) into corresponding optical signals that are transmitted through an optical port (not shown). Accordingly, the ROSA 102 serves as an optical-electronic transducer and the TOSA 104 serves as an electronic-optical transducer. The optical ports (not shown) are configured to physically and optically connect the optical transmitter and the optical receiver with optical fiber connectors such as LC or SC connectors (not shown) that are connected to the optical ports.

Having described a specific environment with respect to FIG. 1, it will be understood that this specific environment is only one of countless architectures in which example embodiments of the present invention may be employed. The scope of the present invention is not intended to be limited to any particular environment.

2. Example OSA Having an Example EMR Shield

Figure 2A:
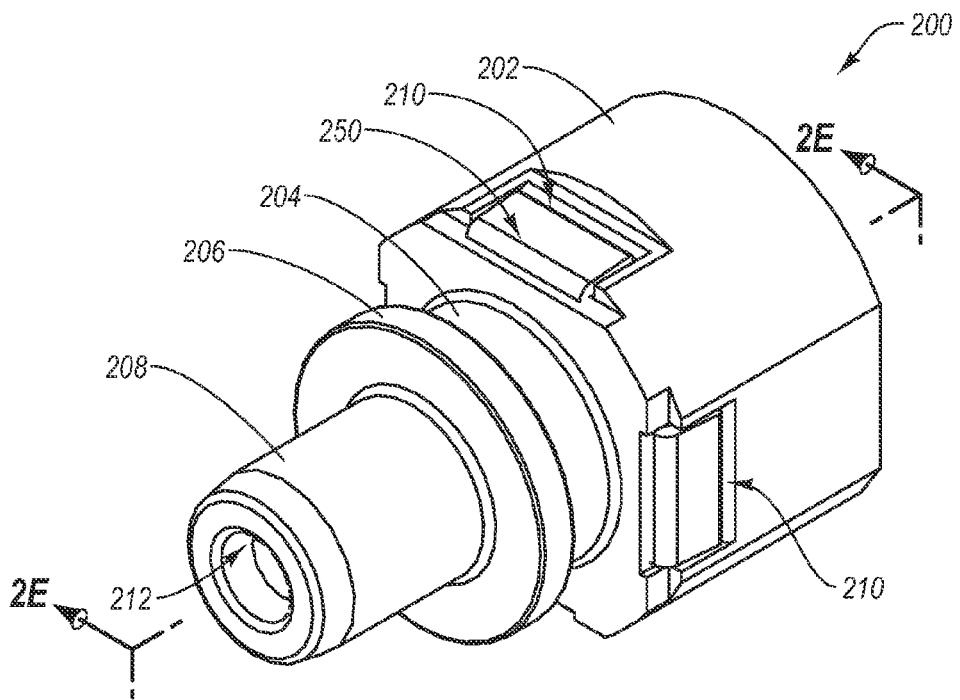
FIG. 2A is a perspective view of a portion of an example optical subassembly (OSA) with an example electromagnetic radiation (EMR) shield partially embedded therein.

With reference now to FIGS. 2A-2E, an example OSA including an example EMR shield is disclosed. With particular reference first to FIG. 2A, the example OSA, denoted generally at 200, includes a body and an example EMR shield 250. The body includes a receptacle 202, a neck 204 extending from the receptacle 202, a flange 206 extending from the neck 204, and a barrel 208 extending from the flange 206. The receptacle 202 may further include one or more recesses 210, which will be discussed in greater detail below. In one example embodiment, the receptacle 202, neck 204, flange 206, and barrel 208 of the OSA 200 are integrally formed from an optically transmissive plastic material that is molded into the shape disclosed in FIG. 2A.

Figure 2B:
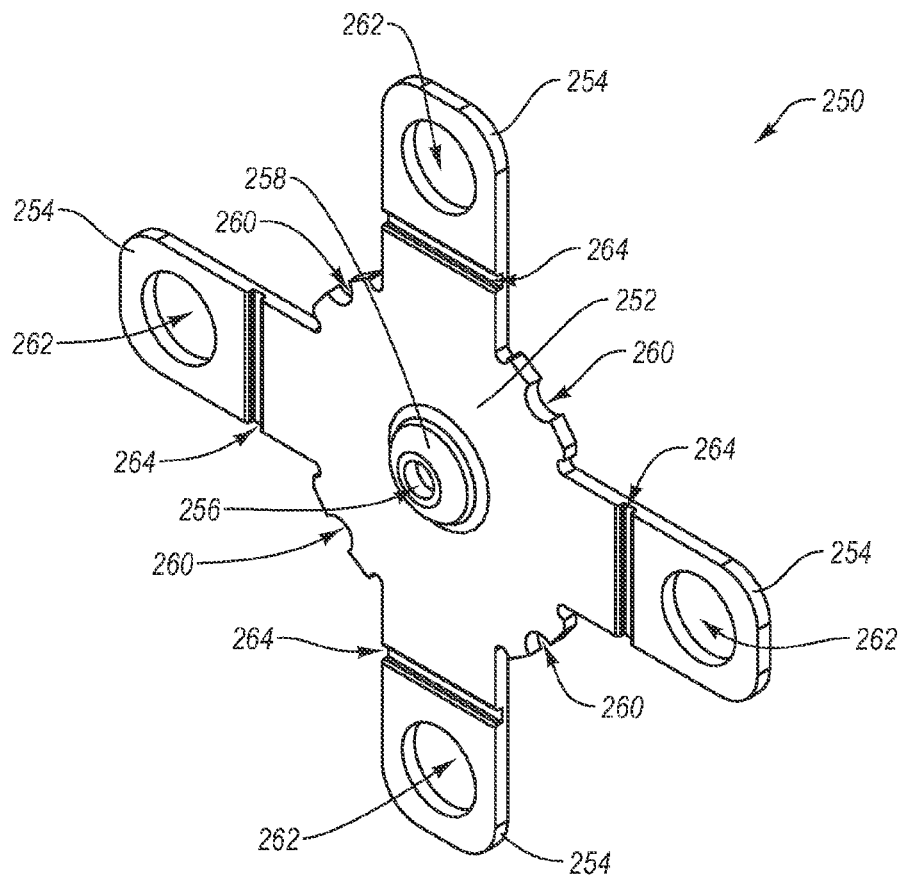
FIG. 2B is a perspective view of the example EMR shield of FIG. 2A showing the shield as configured prior to installation in the OSA.
Figure 2C:
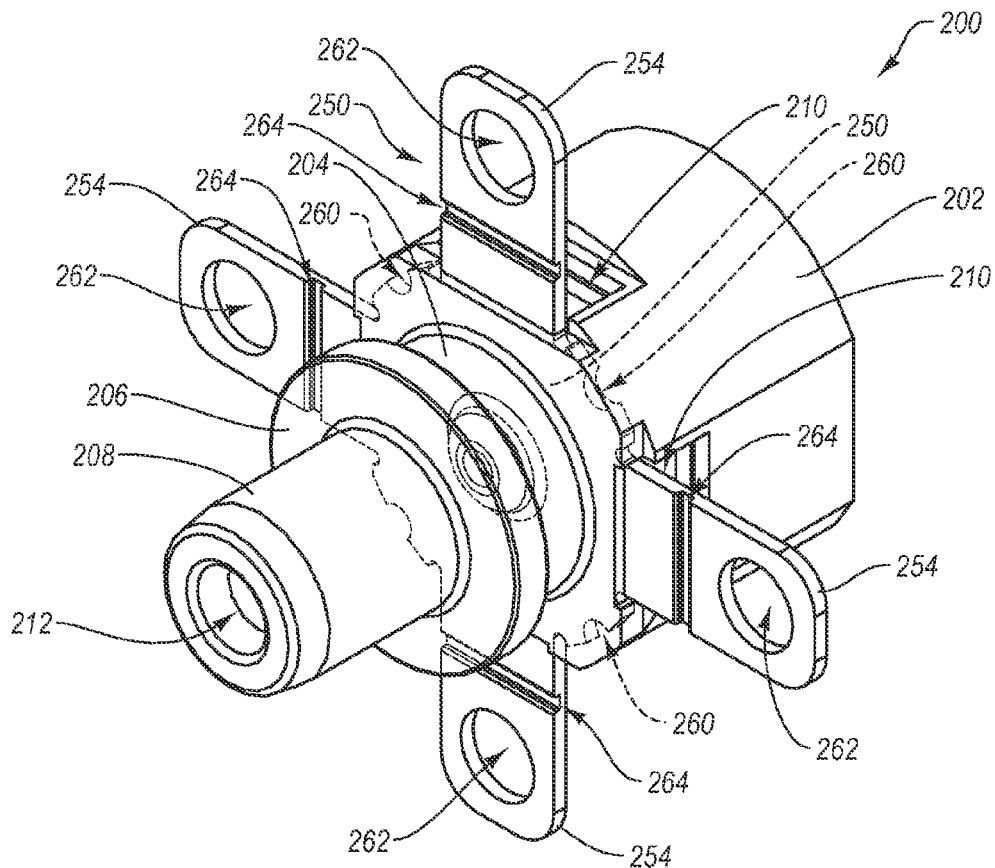
FIG. 2C is a perspective view of the example EMR shield of FIG. 2A partially installed in the example OSA of FIG. 2A.
Figure 2D:
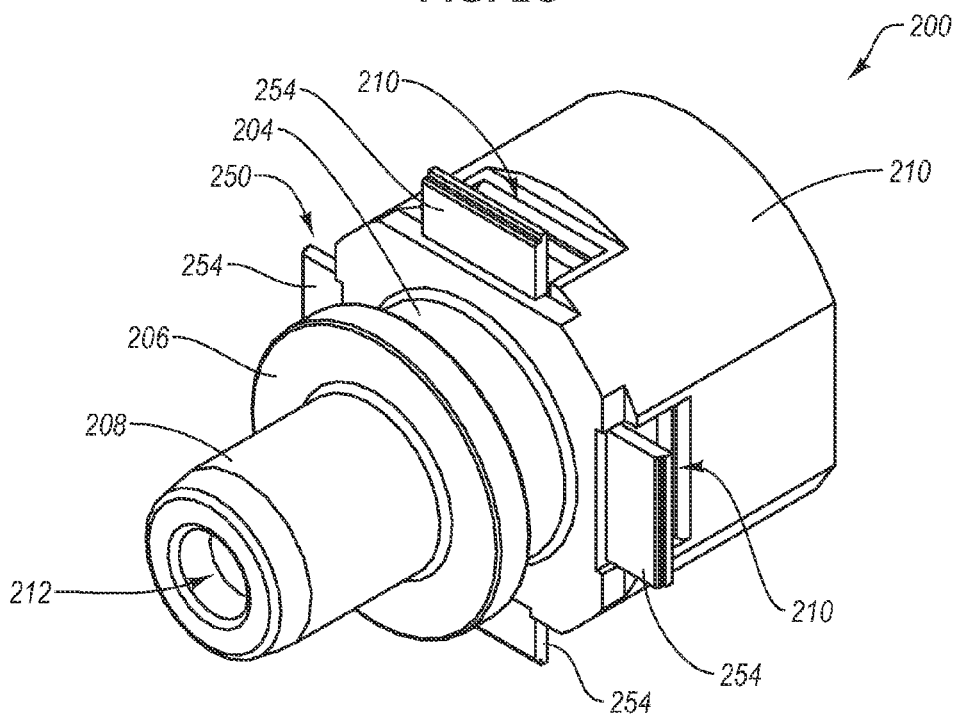
FIG. 2D is a perspective view of the example EMR shield of FIG. 2A partially installed in the example OSA of FIG. 2A after having portions of the EMR shield removed.
Figure 2E:
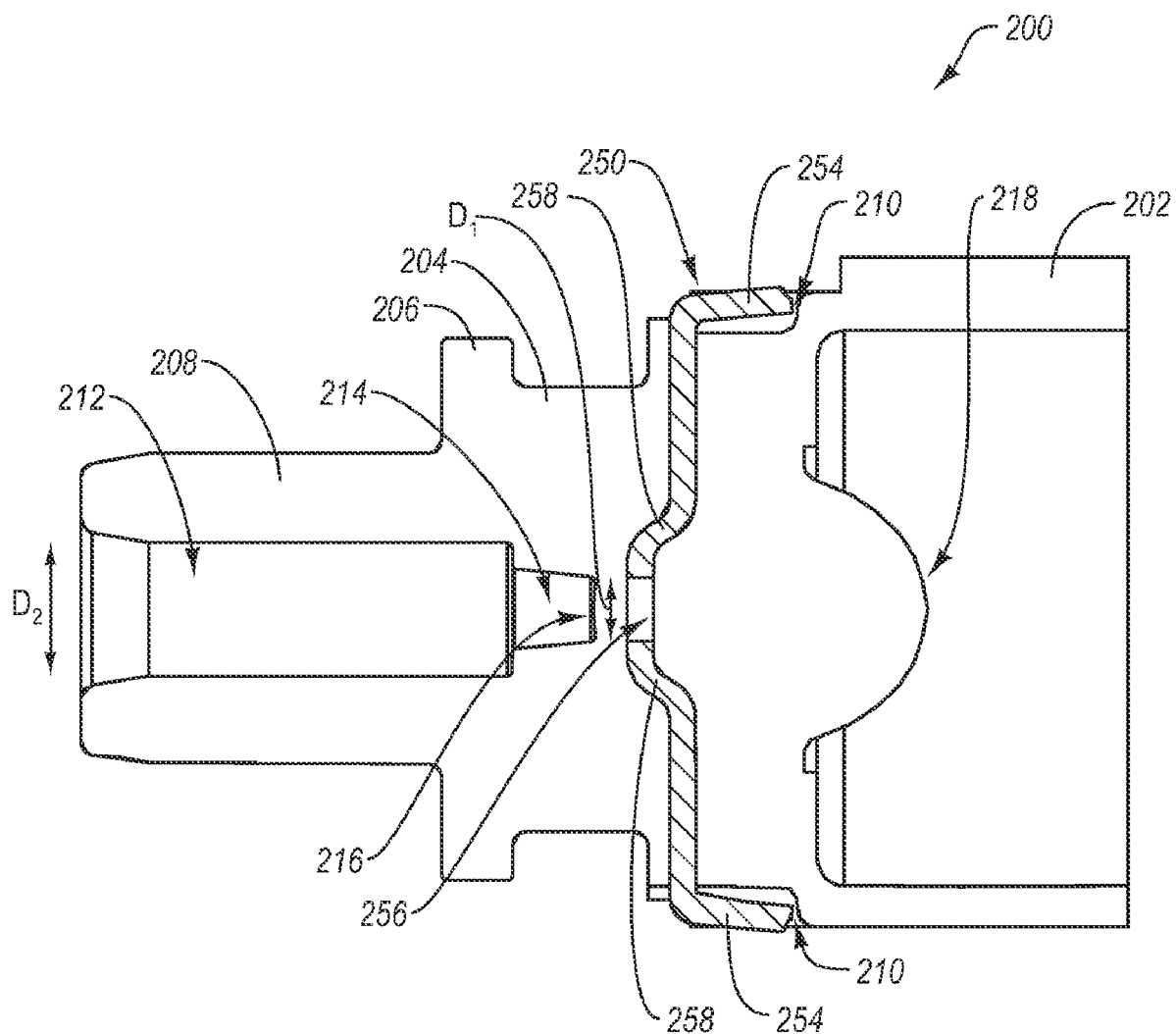
FIG. 2E is a cross-sectional side view of the example OSA and the example EMR shield partially embedded therein of FIG. 2A.

With continuing reference to FIG. 2A, the example OSA 200 also includes an example EMR shield 250 that is partially embedded in the body (also see FIG. 2E). With particular reference now to FIG. 2B, the example EMR shield 250 includes a central portion 252, four arms 254 extending radially outward from the central portion 252 at substantially regular intervals, a substantially centrally located opening 256 defined in the central portion 252, an optional substantially centrally located indentation 258 defined in the central portion 252, and a plurality of optional notches 260 defined along the perimeter of the central portion 252. In addition, each arm 254 may optionally define an aperture 262. Further, each arm 254 may optionally define a score-line 264 between the aperture 262 and the central portion 252. In general, a given embodiment of the EMR shield 250 may include variable configurations including, but not limited to, the number, spacing, geometry, size, and locations of the arms 254.

In one example embodiment, the EMR shield 250 can be stamped or otherwise produced from a material that is effective at controlling passage of EMR, such as stainless steel sheet metal, one example of which is electrolytically tin plated (SPTE) sheet metal, or other sheet metal. In some example embodiments, the EMR shield 250 may be formed from sheet metal having a thickness of about 0.25 mm and/or formed from sheet metal that is ¾ hard or is full hard. In other example embodiments, it is understood that the EMR shield 250 can be formed, using stamping or other processes, from other materials that are effective at controlling passage of EMR.

Although the central portion 252 may be substantially circular, it is understood that the central portion 252 may instead have another shape including, for example, triangular, rectangular, or polygonal. In some example embodiments, the shape of the central portion 252 may be substantially the same as a cross-sectional shape of the receptacle or other portion of an OSA body into which the central portion 252 is embedded. For example, the shape of a perimeter of the central portion 252 may be approximately the same as the shape of the receptacle 202 into which the central portion 252 is embedded.

With reference now to FIG. 2C, some details of one example process for manufacturing the example OSA 200 will be disclosed. During the manufacture of the example OSA 200, the EMR shield 250 is placed in a mold (not shown). The apertures 262 may be configured to mate with a structure of the mold, such as a molding tool (not shown), in order to properly position the EMR shield 250 within the mold. The location and size tolerances of the apertures 262 may accordingly need to be tightly controlled in order to properly align the EMR shield 250 within the mold structure. As an alternative to the use of the apertures 262, the EMR shield 250 may be positioned using some portion of the perimeter of the EMR shield 250, in which case the location and size tolerances of the perimeter may need to be tightly controlled. More generally, the EMR shield 250 can include any structural elements(s) suitable to enable positioning and retention of the EMR shield 250 in the mold.

After the EMR shield 250 is properly positioned within the mold, a liquid or semi-liquid optically transmissive plastic material may be injected into the mold. Although the perimeter of the central portion 252, in this example, is approximately the same as that of the receptacle 202 of the OSA 200, the notches 260 (see FIG. 2B) in the perimeter of the central portion 252 may be sized and configured such that the notches 260 at least partially define one or more fluid passageways so that during the molding of the OSA 200, the plastic material from which the OSA 200 is molded can readily flow through the notches 260 to all portions of the mold. In this way, the notches 260 enable the central portion 252 of the EMR shield 250 to be partially embedded in the body of the OSA 200 during the molding of the OSA 200. A portion of the plastic material also remains positioned within the notches 260 after the molding of the example OSA 200. The size, shape, orientation, location, and number of notches 260, and/or other structural features which would provide comparable functionality, defined in the EMR shield 250 can be adjusted according to a variety of factors including, but not limited to, the data rate at which the OSA 200 communicates and the viscosity of the plastic from which the OSA 200 is molded.

With particular reference now to FIG. 2D, once the EMR shield 250 is embedded in the OSA 200, a breakaway portion of each arm 254 may be broken off along the score lines 264. As disclosed in FIG. 2C, the breakaway portions in the disclosed example embodiment include the portions of each arm 254 between the score-line 264 and the distal end of the arm 254. With particular reference again to FIG. 2E, the remaining portion of each arm 254 may be bent into a corresponding recess 210. In some example embodiments, additional score-lines (not shown) may be formed at the location where each arm 254 is intended to be bent. In this way, these additional score-lines may reduce the amount of force required to bend the arm 254. As disclosed in FIG. 2E, a portion of each arm 254 extends outside the receptacle 202 and is biased slightly outward in order to bias against a complementary structure of an optoelectronic module housing (not shown) in which the OSA 200 is positioned. This slightly outward bias can result in relatively secure electrical connections between each arm 254 and the optoelectronic module housing.

In some example embodiments, the portion of one or more of the arms 254 that extends outside the receptacle 202 may remain substantially unbent in order to allow the one or more arms 254 to electrically communicate with a complementary structure of an optoelectronic module housing (not shown) that is positioned further away from the OSA 200.

With continuing reference to FIG. 2E, the OSA 200 further includes a cavity 212 defined within the barrel 208 and the flange 206, a first lens 216 integrally defined within the neck 204, and a second lens 218 integrally defined within the receptacle 202. The cavity 212 is sized and configured to receive an optical fiber and/or an optical fiber ferrule. For those example embodiments where the OSA 200 is molded from optically transmissive plastic, optical signals can pass between the lenses 216 and 218 through the opening 256. In particular, the lenses 216 and 218 are sized, configured, and aligned to focus and/or otherwise process optical signals passing through the opening 256 between a core of an optical fiber positioned in the cavity 212 and an optical transducer (not shown) positioned in the receptacle 202. It is noted that other example embodiments may omit one or both of the lenses 216 and 218.

The opening 256 has a diameter $D_1$ and the cavity 212 has a diameter $D_2$. In the example embodiment disclosed in FIGS. 2A-2E, the diameter $D_1$ of the opening 256 of the EMR shield 250 is smaller than the diameter $D_2$ of the cavity 212 of the OSA 200. Although the diameter $D_2$ of the cavity 212 of the OSA 200 must be large enough to receive an optical fiber and/or an optical fiber ferrule, the core of the optical fiber is generally smaller in diameter than the diameter $D_2$ due to the presence of various cladding layers surrounding the core of the optical fiber and/or due to the optical fiber ferrule surrounding the core. Therefore, even where the diameter $D_1$ is smaller than the diameter $D_2$, the EMR shield 250 can help control the transmission of EMR without materially impeding the transmission of optical signals between the core of an optical fiber received in the cavity 212 and the transducer housed in the receptacle 202. The relatively small diameter $D_1$ of the opening 256 allows only a relatively small amount of EMR to escapes through the opening 256.

In particular, the relatively smaller size of the diameter $D_1$ of the opening 256 can increase the effectiveness of the EMR shield 250 by effecting a relative reduction in the amount of EMR that can escape through the cavity 212 of the OSA 200. The relatively smaller size of the diameter $D_1$ of the opening 256 can also increase the effectiveness of the EMR shield 250 by effecting a relative reduction in the amount of EMR that can enter the OSA 200 through the cavity 212, while also being large enough to allow optical signals to pass between the lenses 216 and 218.

As disclosed in FIG. 2E, the EMR shield 250 can be employed in OSAs such as the OSA 200 where the first lens 216 is positioned in the neck 204. In particular, extension of the indentation 258 of the EMR shield 250 into the neck 204 can enable the EMR shield 250 to be embedded in the OSA 200 while maintaining the opening 256 in close proximity to the first lens 216. Maintaining the opening 256 in close proximity to the first lens 216 can enable the diameter $D_1$ of the opening 256 to be maintained close to the size of the core of an optical fiber (not shown), which can help minimize the EMR that passes through the opening 256 of the EMR shield 250. It is understood that the indentation 258 may be omitted in some embodiments, although the diameter $D_1$ of the opening 256 may need to be enlarged in such embodiments in order to allow optical signals to pass unimpeded between a core of an optical fiber positioned in the cavity 212 and an optical transducer positioned in the receptacle 202. It is understood that an EMR shield can be shaped however necessary to accommodate a particular OSA geometry. Therefore, the configurations of the EMR shield 250 and the EMR shield 350 (disclosed below in connection with FIGS. 3A and 3B) are to be considered as examples only and are not limiting of the scope of the invention.

Also, once the example EMR shield 250 is partially embedded into the receptacle 202 and the neck 204 of the example OSA 200, portions of the arms 254 of the EMR shield 250 can extend beyond the perimeter of the receptacle 202, as disclosed in FIG. 2A. These portions of the arms 254 that extend beyond the perimeter of the receptacle 202 can electrically communicate with a grounded structure, such as a housing, of an optoelectronic module (not shown) into which the OSA 200 is integrated. In one embodiment, for example, one or more of the arms 254 electrically communicate with ground through physical contact with a grounded housing of an optoelectronic module (not shown) into which the OSA 200 is integrated. This electrical contact may be more securely established by bending each arm 254 at an angle α that is slightly less than 90°, thus biasing each arm 254 slightly outward away from the OSA 200 in order to bias each arm 254 against a complementary structure of a grounded optoelectronic module housing (not shown) in which the OSA 200 is positioned. Grounding the EMR shield 250 can further enhance the effectiveness of the EMR shield 250.

3. Another Example OSA Having Another Example EMR Shield

Figure 3A:
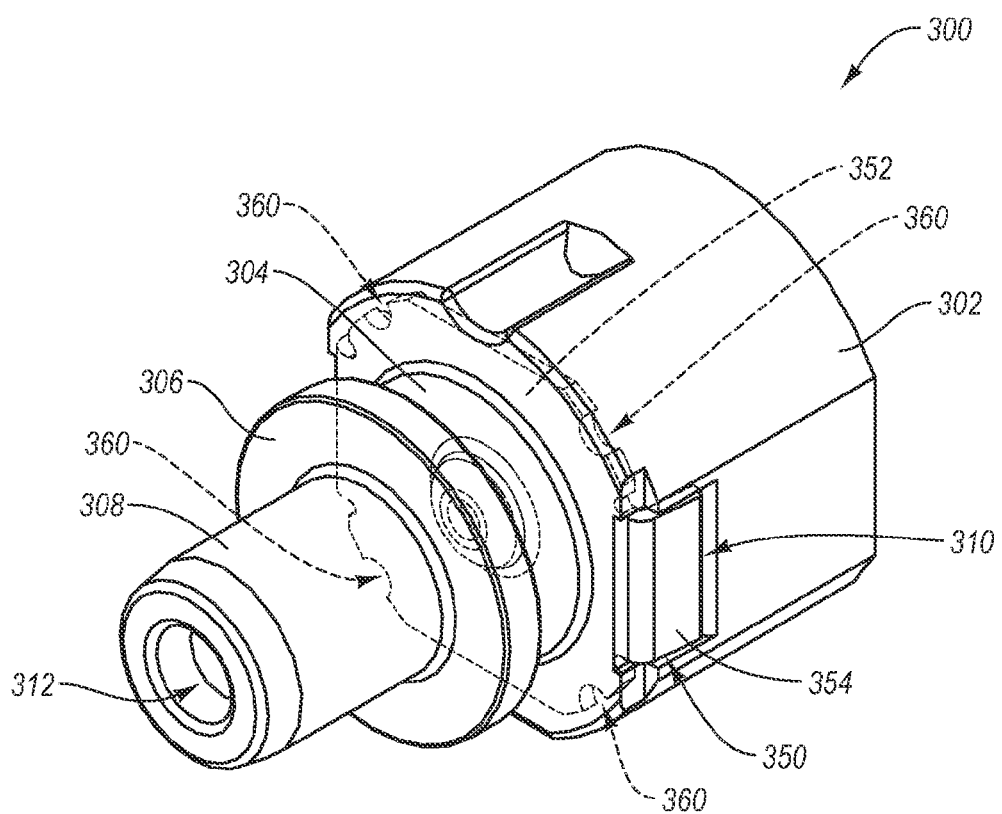
FIG. 3A is a perspective view of a portion of another example optical subassembly (OSA) with another example electromagnetic radiation (EMR) shield partially installed therein.
Figure 3B:
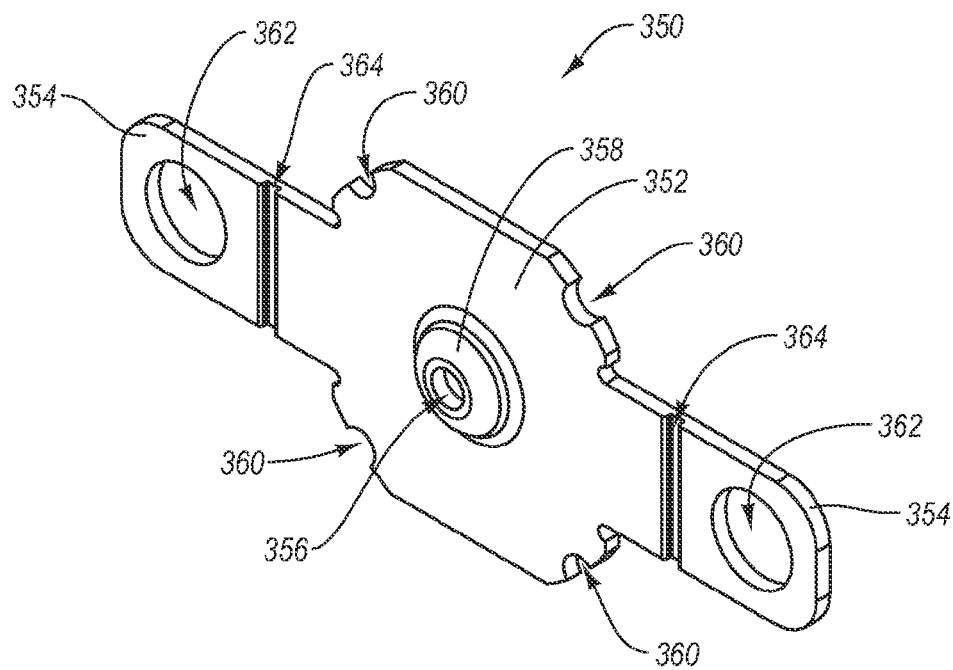
FIG. 3B is a perspective view of the example EMR shield of FIG. 3A, showing the shield as configured prior to installation in the OSA.

With reference now to FIGS. 3A and 3B, another example OSA including another example EMR shield is disclosed. As disclosed in FIG. 3A, the example OSA, denoted generally at 300, includes a body and an example EMR shield 350. The body includes a receptacle 302, a neck 304, a flange 306, and a barrel 308, each of which is integrally molded from a plastic material in this embodiment. The OSA 300 defines one or more recesses 310 (only one of which is shown in FIG. 3A) and a cavity 312. It is noted that in some example embodiments a single recess may be defined that extends around the entire receptacle 302, rather than the OSA 300 including multiple recesses 310 located in multiple discrete locations. The cavity 312 is configured to receive an optical fiber and/or an optical fiber ferrule. The example OSA 300 also includes the example EMR shield 350 that is partially embedded in the body of the OSA 300.

With particular reference now to FIGS. 3A and 3B, the example EMR shield 350 includes a central portion 352, two arms 354 extending radially outward from the central portion 352 at substantially regular intervals, a substantially centrally located opening 356 defined in the central portion 352, an optional substantially centrally located indentation 358 defined in the central portion 352, and a plurality of optional notches 360 defined along the perimeter of the central portion 352. As disclosed in FIG. 3B, the example EMR shield 350 may be identical to the EMR shield 250 of FIGS. 2A-2E except that instead of four arms 254, the EMR shield 350 includes only two arms 354. In addition, the receptacle 302 may be identical to the receptacle 202 of FIGS. 2A-2E except that instead of four recesses 210, the receptacle 302 includes only two recesses 310. Further, apertures 362 and score-lines 364 of the EMR shield 350 may be substantially identical in form and function to the apertures 262 and score-lines 264 of the EMR shield 250.

The example EMR shields disclosed herein can therefore aid in the control of the amount of EMR that passes through OSAs into which the EMR shields are integrated. OSAs that include these EMR shields can, in turn, be effective at limiting the transmission of EMR out of and/or into optoelectronic modules into which the OSAs are integrated. These example OSAs can be effective at limiting the transmission of EMR while avoiding the difficulties and costs associated with coating OSAs with metal or forming OSAs from metal.

The example embodiments disclosed herein may be embodied in other specific forms. The example embodiments disclosed herein are to be considered in all respects only as illustrative and not restrictive.

What is claimed is:

1. An electromagnetic radiation (EMR) shield comprising:
   a central portion whose perimeter is approximately the same size and shape as that of a portion of an associated optical subassembly (OSA);
   a plurality of arms extending radially outward from the central portion, each arm including a breakaway portion in which an aperture is defined, each aperture configured to mate with a corresponding structure of an injection mold in order to position the EMR shield within the mold such that no portion of the material injected into the mold flows through the apertures; and
   a substantially centrally located opening defined in the central portion.

2. The EMR shield as recited in claim 1, wherein the EMR shield comprises stamped sheet metal.

3. The EMR shield as recited in claim 1, further comprising a notch that defines a portion of a fluid passageway defined along the perimeter of the central portion.

4. The EMR shield as recited in claim 1, wherein the central portion is substantially planar.

5. The EMR shield as recited in claim 1, wherein the opening is defined in a substantially centrally located indentation defined in the central portion.

6. The EMR shield as recited in claim 1, wherein the plurality of arms extending radially outward from the central portion comprises two or more arms extending radially outward from the central portion at substantially regular intervals.

7. An OSA comprising:
   a body formed from an optically transmissive plastic material, the body comprising:
      a receptacle;
      a neck extending from the receptacle;
      a flange extending from the neck;
      a barrel extending from the flange, the barrel defining a cavity, the cavity having a diameter; and
   an EMR shield at least partially embedded in the body, the EMR shield comprising:
      a central portion; and
      a plurality of arms extending radially outward from the central portion; and
      a substantially centrally located opening defined in the central portion, the opening having a diameter that is smaller than the diameter of the cavity, the opening being filled with a portion of the optically transmissive plastic material.

8. The OSA as recited in claim 7, further comprising a plurality of notches defined along the perimeter of the central portion, wherein a portion of the plastic material is positioned within the notches.

9. The OSA as recited in claim 7, further comprising a transducer housed in the receptacle.

10. The OSA as recited in claim 7, wherein the EMR shield comprises stamped stainless steel sheet metal.

11. The OSA as recited in claim 7, wherein a portion of each arm extends outside the body and provides spring action to bias against a complementary structure of an optoelectronic module housing.

12. The OSA as recited in claim 7, wherein the opening is defined in a substantially centrally located indentation defined in the central portion, and at least a portion of the indentation extends into the neck.

13. The OSA as recited in claim 7, wherein the plurality of arms extending radially outward from the central portion comprises four arms extending radially outward from the central portion at substantially regular intervals.

14. An optoelectronic module comprising:
    a housing;
    a printed circuit board (PCB) at least partially positioned within the housing; and
    an OSA at least partially positioned within the housing and electrically connected to the PCB, the OSA comprising:
       a body comprising:
          a receptacle with an optical transducer disposed therein;
          a neck extending from the receptacle;
          a flange extending from the neck;
          a barrel extending from the flange, the barrel defining a cavity, the cavity having a diameter;
          a first lens integrally defined within the neck; and
          a second lens integrally defined within the receptacle; and
       an EMR shield at least partially embedded in the body, the EMR shield comprising:
          a central portion;
          a plurality of arms extending radially outward from the central portion, each of the plurality of arms including a portion that extends outside the body and is biased against the housing; and
          a substantially centrally located opening defined in the central portion, the opening having a diameter that is smaller than the diameter of the cavity, wherein the opening is positioned between the first lens and the second lens such that optical signals can pass between the first lens and the second lens through the opening.

15. The optoelectronic module as recited in claim 14, wherein the optoelectronic module has a form factor that is substantially compliant with one of the following MSAs: SFF, SFP, XFP, XPAK, X2, or XENPAK.

16. The optoelectronic module as recited in claim 14, wherein the opening is defined in a substantially centrally located indentation defined in the central portion, and at least a portion of the indentation extends into the neck.

17. The optoelectronic module as recited in claim 14, wherein the plurality of arms extending radially outward from the central portion comprises four arms extending radially outward from the central portion at substantially regular intervals.

18. The EMR shield as recited in claim 3, wherein the opening is the only perforation defined in the central portion.

19. The EMR shield as recited in claim 1, wherein the breakaway portion of each arm is defined between a scoreline and a distal end of the arm.

20. The OSA as recited in claim 7, wherein the body further comprises:
    a first lens integrally defined within the neck; and
    a second lens integrally defined within the receptacle,
    wherein the opening is positioned between the first lens and the second lens such that optical signals can pass between the first lens and the second lens through the opening.

\* \* \* \* \*